US011152548B2

(12) United States Patent
Hwang et al.

(10) Patent No.: US 11,152,548 B2
(45) Date of Patent: Oct. 19, 2021

(54) DISPLAY MODULE AND DISPLAY APPARATUS

(71) Applicant: SAMSUNG ELECTRONICS CO., LTD., Suwon-si (KR)

(72) Inventors: Seon Deok Hwang, Suwon-si (KR); Tae Soon Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/685,244

(22) Filed: Nov. 15, 2019

(65) Prior Publication Data

US 2020/0161514 A1    May 21, 2020

(30) Foreign Application Priority Data

Nov. 16, 2018    (KR) .................... 10-2018-0141254

(51) Int. Cl.
*H01L 33/56*    (2010.01)
*H01L 33/58*    (2010.01)
*H01L 33/00*    (2010.01)
*H01L 25/075*    (2006.01)

(52) U.S. Cl.
CPC .......... *H01L 33/56* (2013.01); *H01L 25/0753* (2013.01); *H01L 33/0095* (2013.01); *H01L 33/58* (2013.01); *H01L 2933/005* (2013.01); *H01L 2933/0058* (2013.01)

(58) Field of Classification Search
CPC ................. H01L 33/56; H01L 33/58
See application file for complete search history.

(56) References Cited

U.S. PATENT DOCUMENTS

| 2014/0227812 | A1  | 8/2014  | Tischler |
| 2016/0316578 | A1* | 10/2016 | Cha ...................... G02B 6/0095 |
| 2017/0315404 | A1* | 11/2017 | Ye ..................... G02F 1/133603 |
| 2019/0244938 | A1* | 8/2019  | Bang ..................... H01L 33/502 |
| 2020/0058718 | A1* | 2/2020  | Wang .................. H01L 27/3246 |

FOREIGN PATENT DOCUMENTS

| KR | 10-0621154   B1 | 9/2006 |
| KR | 10-2007-0104069 A | 10/2007 |
| KR | 10-2017-0140000 A | 12/2017 |
| KR | 10-2018-0008205 A | 1/2018 |
| KR | 10-2018-0081378 A | 7/2018 |

OTHER PUBLICATIONS

International Search Report (ISA/210) in PCT/KR2019/013582, dated Feb. 20, 2020.

\* cited by examiner

*Primary Examiner* — Jay C Chang
*Assistant Examiner* — Mikka Liu
(74) *Attorney, Agent, or Firm* — Sughrue Mion, PLLC

(57) ABSTRACT

A display module is provided. The display module includes a plurality of substrates; a plurality of light-emitting devices mounted on each of the plurality of substrates; a plurality of transparent resins that surrounds the plurality of light-emitting devices; and an opaque molding layer that is disposed on the plurality of substrates between the plurality of transparent resins and covers partial surfaces of the plurality of transparent resins.

20 Claims, 13 Drawing Sheets

DISPLAY MODULE AND DISPLAY APPARATUS

CROSS-REFERENCE TO RELATED APPLICATION

This application is based on and claims priority under 35 U.S.C. § 119 to Korean Patent Application No. 10-2018-0141254, filed on Nov. 16, 2018, in the Korean Intellectual Property Office, the disclosure of which is incorporated by reference herein in its entirety.

BACKGROUND

1. Field

The disclosure relates to a display module, a display apparatus, and a manufacturing method of the display apparatus, and more particularly, to a display module in which self-emissive light-emitting devices are mounted directly on a substrate, a display apparatus, and a manufacturing method of the display apparatus.

2. Description of Related Art

A display apparatus is a type of output apparatus that visually displays images and data information, such as characters, figures, etc. Recently, there has been increased demand for a display apparatus with high brightness, high resolution, a large-screen, high efficiency, and low power. An organic light emitting diode (OLED) panel has many of these characteristics. However, the OLED panel still has many issues that have to be solved, such as improving yield, securing reliability according to enlargement, and securing durability against external environmental conditions such as water.

In regard of a new product for replacing or complementing liquid crystal display (LCD) and OLED panels, a technique for forming a panel by mounting light-emitting devices of emitting light of red (R), green (G), and blue (B) colors directly on a substrate is being studied. However, the technique has many difficulties in a process of transferring light-emitting devices with a size of several µm to hundreds of µm, carried from a wafer, onto a substrate. A technique for physically protecting the light-emitting devices against optical distortion or loss after mounting the light-emitting devices on the substrate also has a great difficulty. Also, a technique for improving the picture quality of the display apparatus, in addition to a technique for protecting the light-emitting devices, is needed.

SUMMARY

Therefore, it is an aspect of the disclosure to provide a display module with an improved structure capable of preventing boundary lines or seams between neighboring substrates from being shown when a large screen is implemented by arranging a plurality of substrates in a matrix form, a display apparatus, and a manufacturing method of the display apparatus.

It is another aspect of the disclosure to provide a display module capable of physically protecting light-emitting devices mounted on a substrate and improving transmittance of light emitted from the light-emitting devices to improve picture quality, a display apparatus, and a manufacturing method of the display apparatus.

Additional aspects of the disclosure will be set forth in part in the description which follows and, in part, will be obvious from the description, or may be learned by practice of the disclosure.

In accordance with an aspect of the disclosure, there is provided a display module that includes: a plurality of substrates; a plurality of light-emitting devices mounted on each of the plurality of substrates; a plurality of transparent resins that surrounds the plurality of light-emitting devices; and an opaque molding layer that is disposed on the plurality of substrates between the plurality of transparent resins and covers partial surfaces of the plurality of transparent resins.

The opaque molding layer may cover side surfaces of the plurality of transparent resins.

A height of one of the plurality of light-emitting devices from a surface of a first substrate from among the plurality of substrates may be a first height, a height of one of the plurality of transparent resins from the surface may be a second height, and a height of the opaque molding layer from the surface may be greater than or equal to the first height and less than or equal to the second height.

The display module may further include a transparent layer that covers the opaque molding layer.

The plurality of transparent resins may be arranged at regular intervals and surrounds the plurality of light-emitting devices, respectively.

The plurality of light-emitting devices may form a plurality of unit pixels, each of the plurality of unit pixels may include at least two of the plurality of light-emitting devices, and the plurality of transparent resins may respectively surround the plurality of unit pixels.

Each of the plurality of transparent resins may surround at least two of the plurality of light-emitting devices.

In accordance with an aspect of the disclosure, there is provided a display apparatus that includes: a plurality of substrates; a frame configured to support the plurality of substrates; a plurality of light-emitting devices mounted on each of the plurality of substrates; a plurality of transparent resins that surround the plurality of light-emitting devices; an opaque molding layer that is disposed on the plurality of substrates between the plurality of transparent resins and covers partial surfaces of the plurality of transparent resins; and a transparent layer that covers the opaque molding layer.

The opaque molding layer may surround side surfaces of the plurality of transparent resins.

A height of one of the plurality of light-emitting devices from a surface of a first substrate from among the plurality of substrates may be a first height, a height of one of the plurality of transparent resins from the surface may be a second height, and a height of the opaque molding layer from the surface may be greater than or equal to the first height and less than or equal to the second height.

The plurality of transparent resins may be arranged at regular intervals and surrounds the plurality of light-emitting devices, respectively.

The plurality of transparent resins may further include a diffusion agent for diffusing light emitted from the plurality of light-emitting devices.

Each of the plurality of transparent resins may include an area that is exposed by the opaque molding layer, and the area of each of the plurality of transparent resins may include a micro protrusion.

In accordance with an aspect of the disclosure, a method of manufacturing a display apparatus includes: adjacently arranging a plurality of substrates on which a plurality of light-emitting devices is mounted; applying a plurality of transparent resins on the plurality of light-emitting devices;

and applying an opaque molding layer on the plurality of substrates between the plurality of transparent resins to fill gaps between the plurality of transparent resins and cover partial surfaces of the plurality of transparent resins.

The applying the opaque molding layer may include applying the opaque molding layer such that the opaque molding layer covers side surfaces of the plurality of transparent resins.

A height of one of the plurality of light-emitting devices from a surface of a first substrate from among the plurality of substrates may be a first height, a height of one of the plurality of transparent resins from the surface may be a second height, and the applying the opaque molding layer may include applying the opaque molding layer such that a height of the opaque molding layer is greater than or equal to the first height and less than or equal to the second height.

The applying the opaque molding layer may include: applying an opaque resin on a surface of a transparent layer that corresponds to an entire area of the plurality of substrates; and attaching the transparent layer on which the opaque resin is applied to the plurality of substrates on which the plurality of transparent resins is disposed.

The method may further include removing the transparent layer.

The applying the opaque molding layer may include: applying an opaque resin on the plurality of substrates between the plurality of transparent resins to fill the gaps between the plurality of transparent resins; and cutting the opaque resin to planarize a front surface of the opaque molding layer.

The applying the plurality of transparent resins may include forming a micro protrusion in a surface of each of the plurality of transparent resins that is exposed by the opaque molding layer.

BRIEF DESCRIPTION OF THE DRAWINGS

These and other aspects, features and advantages of certain embodiments of the present disclosure will be more apparent from the following description taken in conjunction with the accompanying drawings of which.

DETAILED DESCRIPTION

Figure 1:
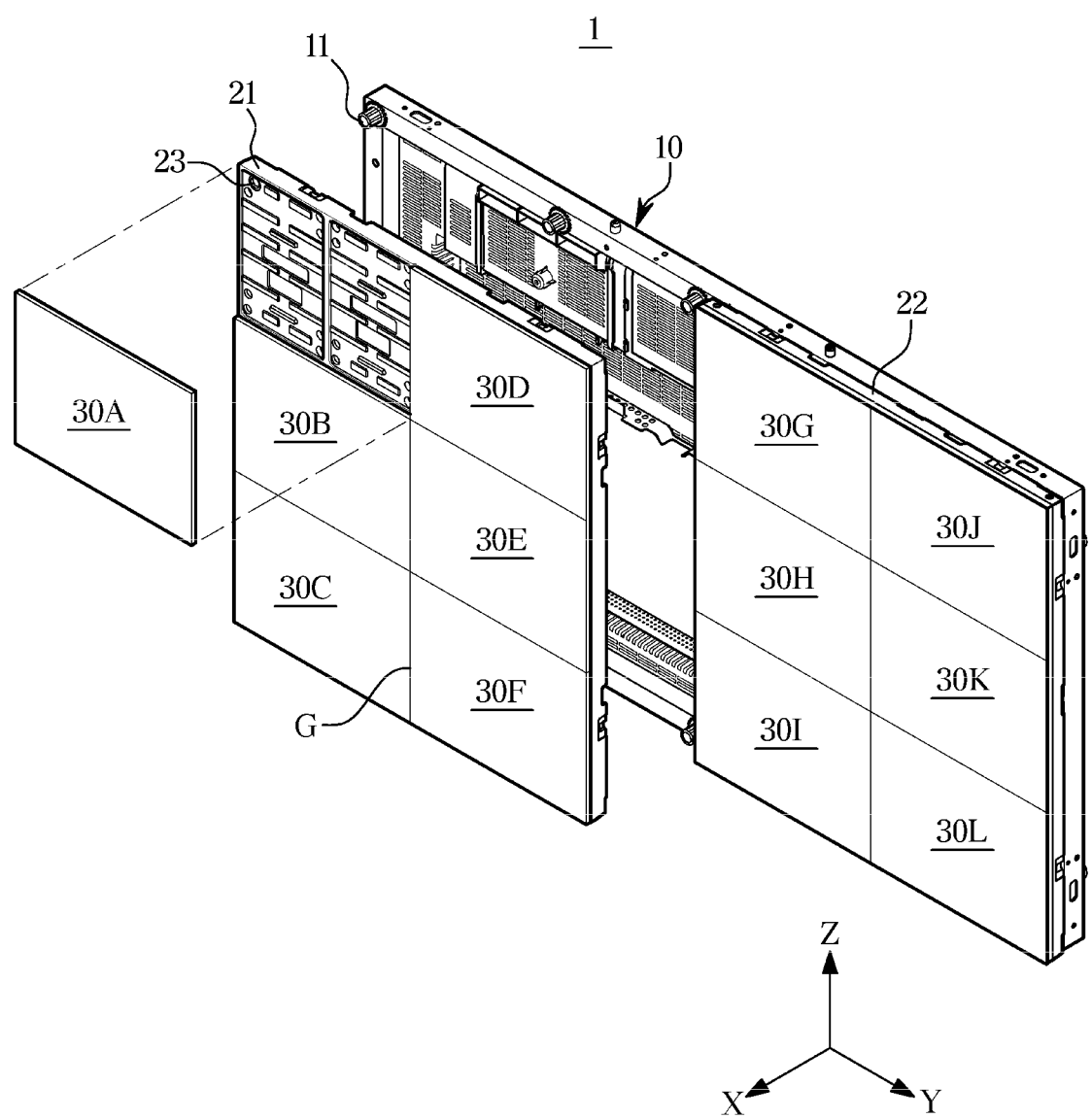
FIG. 1 is a perspective view of a display apparatus according to an embodiment.

The disclosure may be embodied in many different forms and should not be construed as being limited to the embodiments set forth herein. Also, parts in the drawings unrelated to the detailed description may be omitted for clarity. Like reference numerals in the drawings denote like elements.

An expression used in the singular encompasses the expression of the plural, unless it is clearly provided otherwise. Also, it will be understood that, the terms "1st," "first," "2nd," or "second," may use corresponding components regardless of importance or order and are used to distinguish a component from another without limiting the components.

In the present specification, it is to be understood that the terms such as "comprising", "including" or "having", etc., indicate the existence of the features, numbers, operations, components, parts, or combinations thereof disclosed in the specification, and are not intended to preclude the possibility that one or more other features, numbers, operations, components, parts, or combinations thereof may exist or may be added.

In the following description, the terms "front surface", "rear surface", "upper portion" and "lower portion" are defined based on the drawings, and the shapes and positions of the corresponding components are not limited by the terms.

Hereinafter, embodiments will be described in detail with reference to the accompanying drawings.

FIG. 1 is a perspective view of a display apparatus according to an embodiment. In FIG. 1, "X" represents a front-back direction, "Y" represents a left-right direction, and "Z" represents an up-down direction.

As shown in FIG. 1, a display apparatus 1 may be an apparatus for displaying information, materials, data, etc. in the form of characters, figures, graphs, images, etc. The display apparatus 1 may be implemented as a television (TV), a personal computer (PC), a mobile device, a digital signage, etc. The display apparatus 1 may be installed on a stand to sit on the ground or installed on a wall.

The display apparatus 1 may include a cabinet 10, a plurality of display modules 30A to 30L that may be installed in the cabinet 10, and a plurality of frames 21 and 22 for supporting the cabinet 10, a plurality of substrates 40, and the plurality of display modules 30A to 30L. The cabinet 10 may support the plurality of display modules 30A to 30L, and form a part of an outer appearance of the display apparatus 1.

The plurality of display modules 30A to 30L may be arranged in the form of a M×N matrix in up, down, left, and right directions to be adjacent to each other. In FIG. 1, 12 display modules 30A to 30L may be coupled in the form of a 3×4 matrix with the cabinet 10. However, the quantity and arrangement of the plurality of display modules 30A to 30L are not limited, and may change variously.

As such, the display apparatus 1 according to the disclosure may be implemented as a large screen by tiling the plurality of display modules 30A to 30L.

Also, the number of the frames 21 and 22 is not limited. Some display modules, for example display modules 30A to 30F among the plurality of display modules 30A to 30L, may be installed in the cabinet 10 by the frame 21, and the other display modules, for example display modules 30G to 30L, may be installed in the cabinet 10 by the frame 22. Also, each of the plurality of display modules 30A to 30L may include a plurality of substrates 40, and the plurality of substrates 40 may be independently supported by the frames 21 and 22.

A cabinet coupling portion 11 may be provided in the cabinet 10. A frame coupling portion 23 may be provided in the frames 21 and 22. The cabinet coupling portion 11 and frame coupling portion 23 may be used to install the display modules 30A to 30L in the cabinet 10. The cabinet coupling portion 11 may be coupled with the frame coupling portion 23 by various methods, such as a magnetic force using a magnet, a mechanical insertion structure, etc.

The display apparatus 1 may further include a control board for driving the plurality of display modules 30A to 30L, and a power supply for supplying power to the plurality of display modules 30A to 30L.

The plurality of display modules 30A to 30L may be flat or curved. Also, the plurality of display modules 30A to 30L may have a variable curvature.

Figure 2:
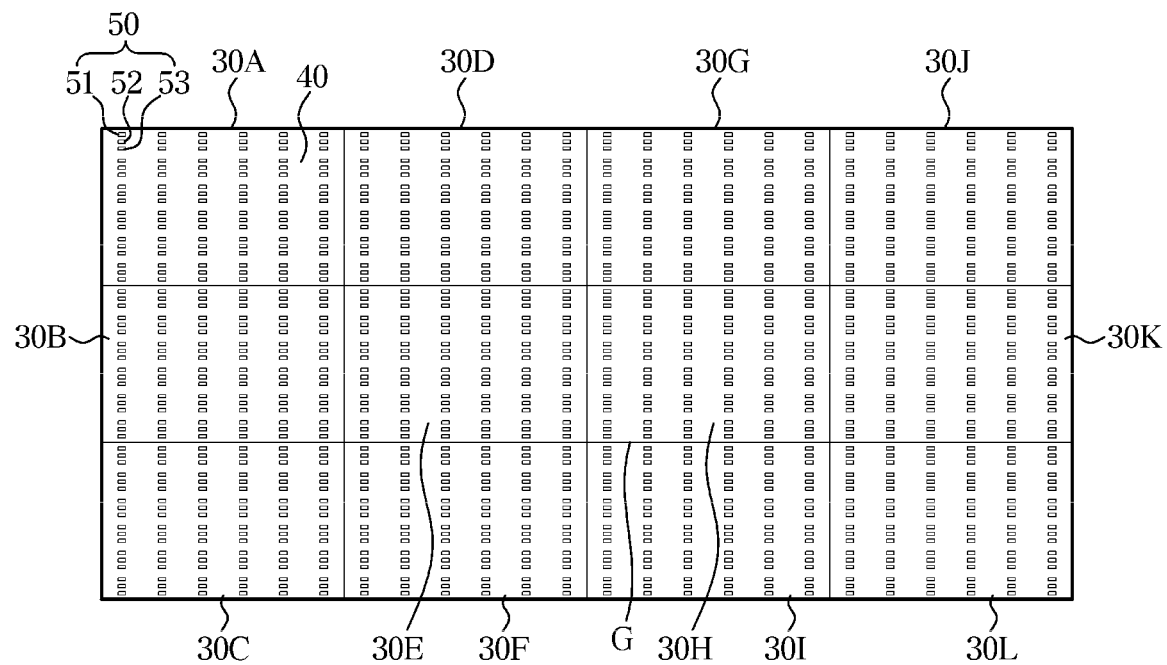
FIG. 2 is a front view showing a state in which a plurality of display modules are arranged in a matrix form according to an embodiment.
Figure 3:
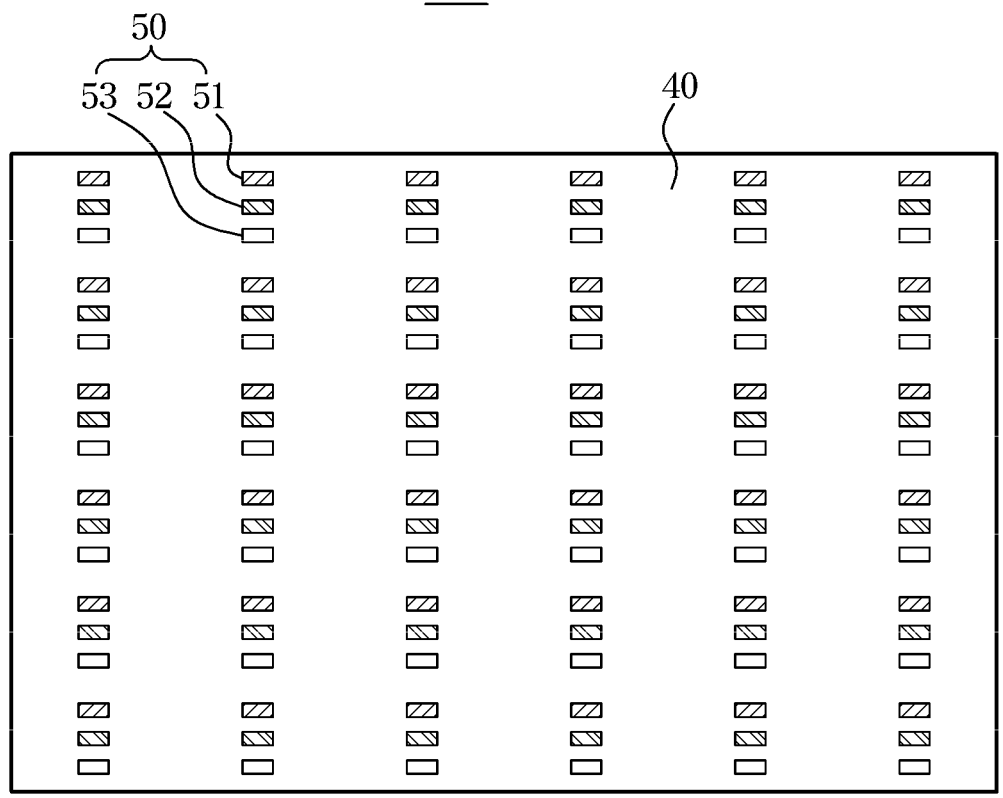
FIG. 3 is a front view of a display module according to an embodiment.

FIG. 2 is a front view showing a plurality of display modules arranged in a matrix according to an embodiment. FIG. 3 is a front view of a display module according to an embodiment, and FIG. 4 is a perspective view of a display module according to an embodiment.

Each of the display modules 30A to 30L illustrated in FIGS. 1 and 2 includes a single substrate 40. However, embodiments are not limited thereto, and each of the display modules 30A to 30L may include a plurality of substrates 40. Also, the plurality of display modules 30A to 30L may be connected to form a display module. In other words, the display apparatus 1 may include a plurality of substrates 40 on which a plurality of light-emitting devices 50 is mounted. However, in FIGS. 3 to 8, a single substrate 40 is shown for convenience of description.

Figure 4:
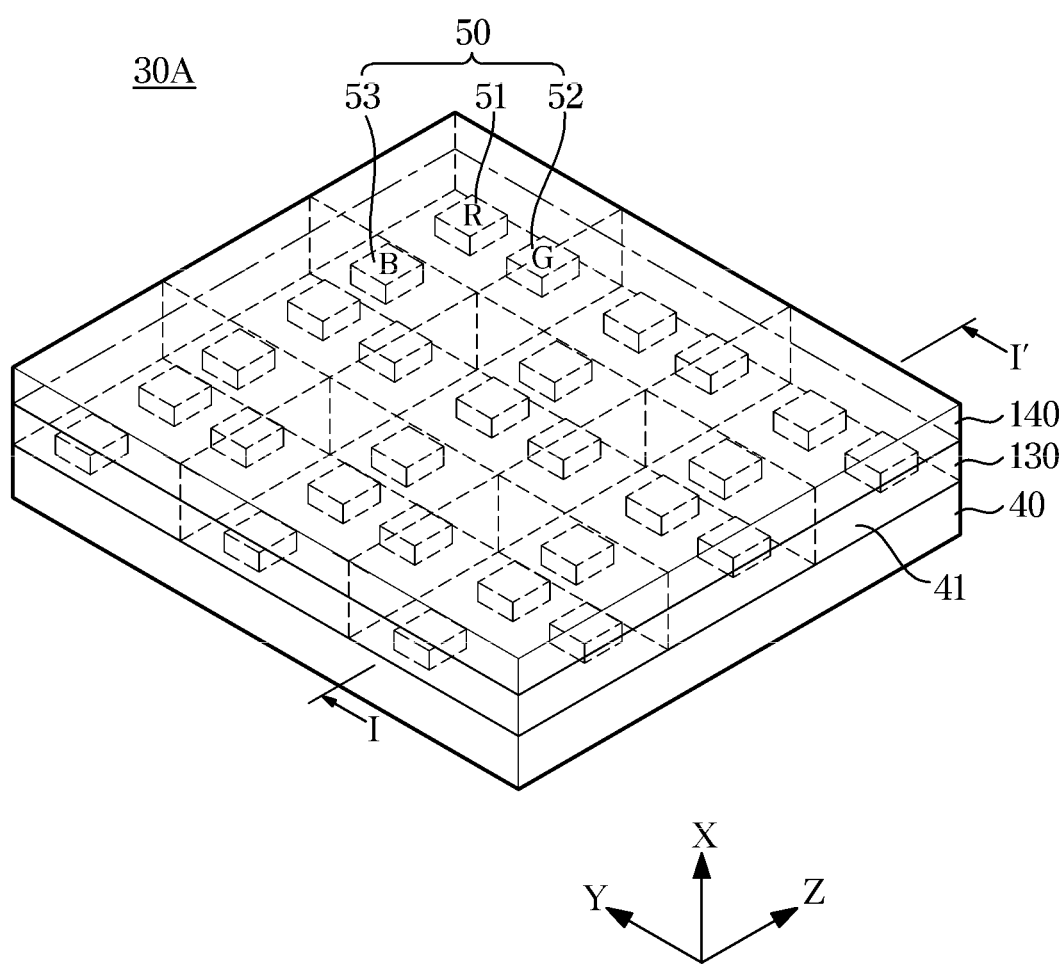
FIG. 4 is a perspective view of a display module according to an embodiment.

Referring to FIGS. 2 to 4, the display modules 30A to 30L may include the substrate 40, and the plurality of light-emitting devices 50 may be mounted on an installation surface 41 of the substrate 40.

The substrate 40 may be made of polyimide (PI), FR4, glass, etc. On the installation surface 41 of the substrate 40, a pattern forming a driving circuit and a plurality of electrodes electrically connected to the plurality of light-emitting devices 50 may be formed. The substrate 40 may include a thin film transistor (TFT), and first and second pad electrodes to which the light-emitting devices 50 are electrically connected may be formed on an upper surface of the substrate 40. The substrate 40 may include a printed circuit board (PCB), a metal core PCB (MCPCB), a flexible PCB (FPCB), etc.

The light-emitting devices 50 may include an n-type semiconductor, an active layer, a p-type semiconductor, a first contact electrode, and a second contact electrode, and may be a flip chip form in which the first contact electrode and the second contact electrode are arranged toward the same direction. Also, the first and second contact electrodes of the light-emitting devices 50 may be respectively soldered at the electrodes formed on the substrate 40. Also, the light-emitting devices 50 may be bonded on the substrate 40 by a bonding material made of a resin (for example, epoxy, silicon, urethane, and the like), an anisotropic conductive film (ACF), etc.

The light-emitting devices 50 may include light-emitting diodes (LEDs). The light-emitting devices 50 may be manufactured with an inorganic material. Accordingly, the light-emitting devices 50 may have high durability and long lifecycles compared to OLEDs that are manufactured with an organic material. Additionally, the light-emitting devices 50 may also have power efficiency that is several times greater than that of the OLEDs.

The light-emitting devices 50 may include a red light-emitting device 51, a green light-emitting device 52, and a blue light-emitting device 53. In the light-emitting devices 50, the red light-emitting device 51, the green light-emitting device 52, and the blue light-emitting device 53 may be grouped into one unit and mounted on the substrate 40.

A group of the red light-emitting device 51, the green light-emitting device 52, and the blue light-emitting device 53 may form a pixel. The red light-emitting device 51, the green light-emitting device 52, and the blue light-emitting device 53 may each form a sub pixel. Each of the display modules 30A to 30L may display an image by selectively turning on/off, or controlling brightness levels of sub pixels forming a plurality of pixels. That is, the display modules 30A to 30L may be defined as multi-pixel modules or multi-pixel packages.

As shown in FIGS. 2 and 3, the red light-emitting device 51, the green light-emitting device 52, and the blue light-emitting device 53 may be arranged in a line and spaced apart from each other. Also, as shown in FIG. 4, the red light-emitting device 51, the green light-emitting device 52, and the blue light-emitting device 53 may be arranged in a horizontal direction and a vertical direction to form a '¬' shape. However, arrangements of the light-emitting devices 50 are not limited to these, and the light-emitting devices 50 may be arranged in another shape. Also, each pixel may include additional sub pixels formed by additional light-emitting devices, such as a white light-emitting device or a cyan light-emitting device.

The light-emitting devices 50 may be picked up from a wafer and then transferred directly on the substrate 40. The light-emitting devices 50 may be picked up and transferred by an electrostatic method using an electrostatic head or an adhesive method using an elastic polymer material, such as polydimethylsiloxane (PDMS) or silicon, as a head. Horizontal lengths, vertical lengths, and heights of the light-emitting devices 50 may be several μm to hundreds of μm. For example, the light emitting device 50 may be a micro LED having a size of 1 μm to 100 μm. The height of the light emitting device 50 may be 7 μm to 10 μm. The largest value among the horizontal length, the vertical length, and the height may be 100 μm or less.

FIGS. 5 to 8 are cross-sectional views of display modules according to different embodiments.

Referring to FIGS. 5 to 8, a display module 30A may include a plurality of transparent resins 120 surrounding the light-emitting devices 50, and an opaque molding layer 130 surrounding the transparent resins 120 and covering a front surface of the substrate 40. When the display module 30A includes a plurality of substrates 40, the plurality of substrates 40 may be arranged to be adjacent to each other, and a plurality of light-emitting devices 50 may be mounted on each substrate 40. In this case, the opaque molding layer 130 may cover partial surfaces of the transparent resins 120 and surfaces of the substrates 40 between the plurality of transparent resins 120.

Figure 8:
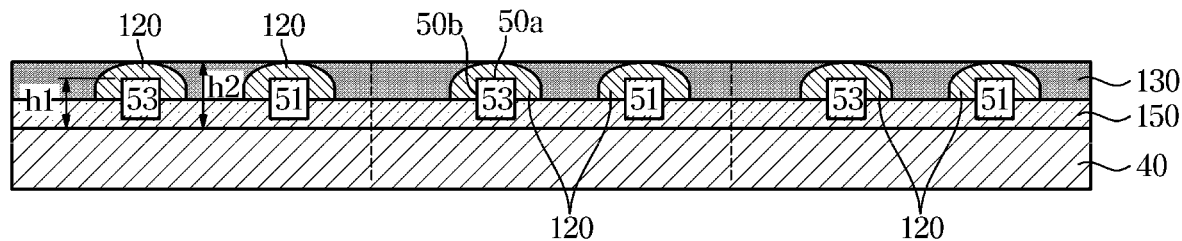

On a front surface of the opaque molding layer 130, a transparent layer 140 may be further provided to protect the light-emitting devices 50 and the substrates 40 covered with the opaque molding layer 130. However, the transparent layer 140 may be not included in the display module 30A, as shown in FIG. 8.

As described above, the light-emitting devices 50 may be arranged in various shapes on the substrate 40. That is, the red light-emitting device 51, the green light-emitting device 52, and the blue light-emitting device 53 constituting one pixel may be arranged in a line or in a '¬' shape.

FIGS. 5 to 8 show cross-sections I-I' of the display module 30A in which the red light-emitting device 51, the green light-emitting device 52, and the blue light-emitting device 53 constituting one pixel are arranged in a '¬' shape on the substrate 40, as shown in FIG. 4.

Figure 5:
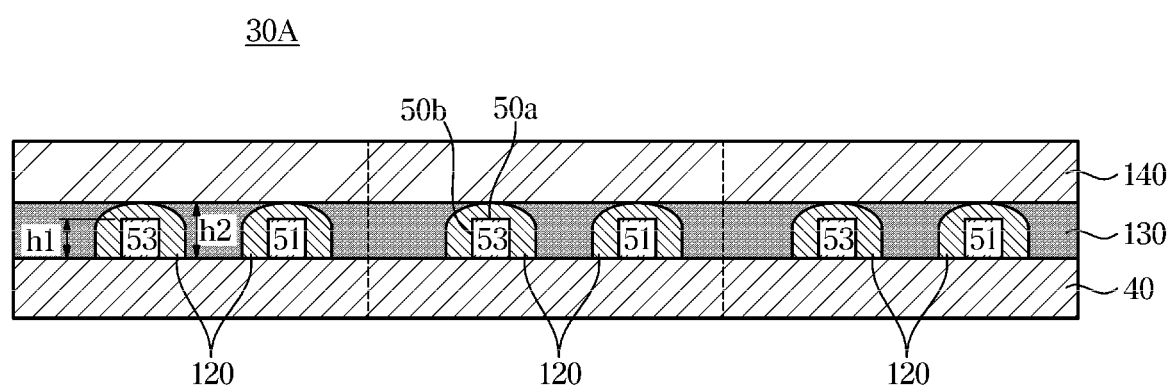
FIGS. 5 to 8 are cross-sectional views of display modules according to different embodiments.

Referring to FIG. 5, the transparent resin 120 may be provided on each of the light-emitting devices 50 mounted on the substrate 40. The transparent resin 120 may be applied at regular intervals to surround each of the light-emitting devices 50. That is, the transparent resin 120 may surround each of the red light-emitting device 51, the green light-emitting device 52, and the blue light-emitting device 53.

The transparent resins 120 may surround the light-emitting devices 50 so that the transparent resins 120 surround upper surfaces (also, referred to as light-emitting surfaces) 50a and side surfaces of the light-emitting devices 50, but do not cover lower surfaces of the light-emitting devices 50. More specifically, because the light-emitting devices 50 are mounted on the substrate 40, the lower surfaces of the light-emitting devices 50 being in direct/indirect contact with the installation surface 41 of the substrate 40 may be not covered by the transparent resins 120.

Figure 6:
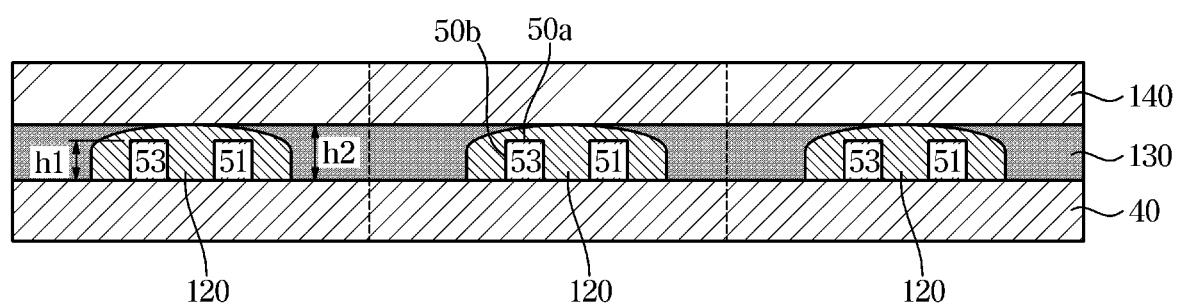

Also, referring to FIG. 6, multiple light-emitting devices may form a unit pixel. The transparent resin 120 may surround the light-emitting devices constituting the unit pixel among the light-emitting devices 50. More specifically, the transparent resin 120 may surround the red light-emitting device 51, the green light-emitting device 52, and the blue light-emitting device 53 constituting one pixel among the light-emitting devices 50 altogether. That is, the transparent resin 120 may be applied for each unit pixel. In this case, likewise, the transparent resin 120 may cover the upper and side surfaces of the light-emitting devices 50 constituting a unit pixel except for the lower surfaces of the light-emitting devices 50 being in contact with the substrate 40. The transparent resin 120 may be formed to a predetermined height from the light-emitting surfaces 50a of the light-emitting devices 50 toward the front direction X of the display modules 30A to 30L.

The transparent resin 120 may be applied, coated, or jetted through a transparent resin supplying apparatus 160 to surround the light-emitting devices 50. However, a method of supplying the transparent resin 120 is not limited to this. The transparent resin 120 may be made of acrylic urethane, epoxy, silicon, polyester, or the like, although embodiments are not limited thereto.

The opaque molding layer 130 may surround the plurality of transparent resins 120 and cover the front surface of the substrate 40. More specifically, the opaque molding layer 130 may cover partial surfaces of the plurality of transparent resins 120 and fill gaps between the plurality of transparent resins 120. In other words, the opaque molding layer 130 may cover the plurality of transparent resins 120 so that light is emitted toward the front direction X of the display modules 30A to 30L through the light-emitting surfaces 50a of the plurality of light-emitting devices 50. The opaque molding layer 130 may cover side surfaces of the plurality of transparent resins 120 corresponding to the respective side surfaces 50b of the plurality of light-emitting devices 50. The opaque molding layer 130 may expose at least a portion of a top surface of the plurality of transparent resins 120. When the display module 30A includes a plurality of substrates 40, the opaque molding layer 130 may cover front surfaces of the substrates 40 to cover boundary lines or seams G that exist between the substrates 40.

For example, a height of the opaque molding layer 130 may be greater than or equal to a first height h1 and less than or equal to a second height h2 from the surface (installation surface 41) of the substrate 40. More specifically, a height of the opaque molding layer 130 may be greater than or equal to the first height h1 corresponding to a height of the plurality of light-emitting devices 50 from the installation surface 41 of the substrate 40, and may be less than or equal to the second height h2 corresponding to a height of the plurality of transparent resins 120 from the surface (installation surface 41) of the substrate 40.

The first height h1 and the second height h2 may change according to designs. Also, the second height h2 may be lower than the height of the transparent resin 120 from the installation surface 41 of the substrate 40. Because light needs to be emitted through the light-emitting surfaces 50a of the light-emitting devices 50, areas of the transparent resins 120 corresponding to the light-emitting surfaces 50a of the light-emitting devices 50 may be not covered with the opaque molding layer 130.

Figure 7:
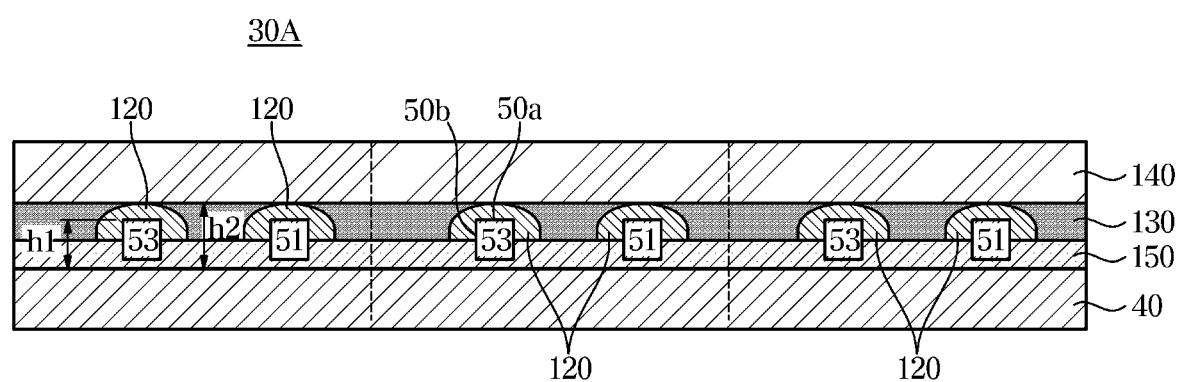

Referring to FIGS. 7 and 8, the light-emitting devices 50 may be bonded on the substrate 40 through a bonding material 150 made of a resin (for example, epoxy, silicon, urethane, and the like), anisotropic conductive film (ACF), etc. The bonding material 150 may have a predetermined thickness. For example, the bonding material 150 may be applied on the substrate 40, and then, the light-emitting devices 50 may be mounted on the bonding material 150. When the light-emitting devices 50 are mounted on the bonding material 150, a pressure may be applied to the bonding material 150. Accordingly, the light-emitting devices 50 may be mounted in such a way to be stuck in the bonding material 150. In this case, the transparent resins 120 may be applied on the bonding material 150 to surround the light-emitting devices 50. Accordingly, the transparent resins 120 may surround the light-emitting surfaces 50a of the light-emitting devices 50 and some portions of the side surfaces 50b of the light-emitting devices 50, without surrounding the entire of the side surfaces 50b of the light-emitting devices 50. Also, the opaque molding layer 130 may be provided on the bonding material 150 to surround the side surfaces of the transparent resins 120 and cover the front surface of the substrate 40.

As such, when the light-emitting devices 50 are surrounded by the transparent resins 120, the light-emitting devices 50 may be protected, and loss of light emitted from the light-emitting devices 50 may be reduced. When the light-emitting devices 50 and the side surfaces of the transparent resins 120 are surrounded by the opaque molding layer 130, light-emitting areas of the light-emitting devices 50 may be toward the front direction of the display module. That is, light emitted from the side surfaces 50b of the light-emitting devices 50 may be blocked or absorbed by the opaque molding layer 130. Accordingly, when the plurality of substrates 40 or the plurality of display modules 30A to 30L on which the plurality of light-emitting devices 50 are mounted are tiled, boundary lines or seams G between neighboring substrates or display modules may not be visible.

The transparent layer 140 may be provided on the opaque molding layer 130 to protect the light-emitting devices 50 against optical distortion. Also, the transparent layer 140 may planarize the opaque molding layer 130. A parting agent may be interposed between the transparent layer 140 and the opaque molding layer 130, and after the opaque molding layer 130 is hardened, the transparent layer 140 may be removed. The transparent layer 140 may be formed of a transparent material, such as glass, transparent plastic, an optical film, or the like.

FIG. 8 illustrates a display module according to an embodiment. As illustrated, the display module 30A may not include transparent layer 140.

Figure 9:
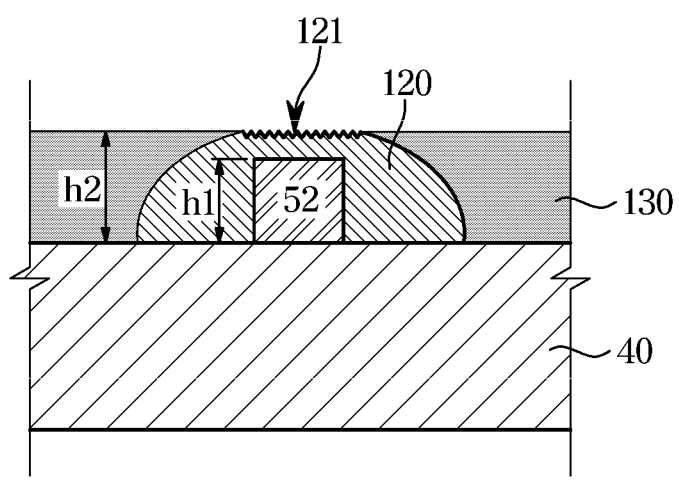
FIG. 9 shows micro protrusions formed in a surface of a transparent resin according to an embodiment.

FIG. 9 shows micro protrusions formed in a surface of a transparent resin according to an embodiment.

Referring to FIG. 9, a plurality of micro protrusions 121 may be formed in a surface of the transparent resin 120. For example, the micro protrusions 121 forming an uneven pattern may be formed in a surface of the transparent resin 120 corresponding to the light-emitting surface 50a of the light-emitting device 50. The micro protrusions 121 formed in the surface of the transparent resin 120 may refract light emitted from the light-emitting device 50, and accordingly, viewing angle characteristics of the display module may be improved.

According to an embodiment, the transparent resin 120 may include a diffusion agent or a scattering agent for diffusing light emitted from the light-emitting device 50. The diffusion agent or the scattering agent included in the transparent resin 120 may diffuse light emitted from the light-emitting device 50 to thereby reduce light loss and improve viewing angle characteristics of the display module.

According to an embodiment, the transparent resin 120 may include a light-absorbing pigment. When the transparent resin 120 includes a light-absorbing pigment, a wavelength of light emitted from the light-emitting device 500 may be shortened, and accordingly, color purity may be improved.

According to an embodiment, the transparent resin 120 may include a fluorescent material. The fluorescent material may change a color of light emitted from the light-emitting device 50. For example, when a blue light-emitting device 40 is mounted on the substrate 40, a fluorescent material may be mixed in the transparent resin 120 surrounding the blue light-emitting device 40 so that red or green light is emitted.

Hereinafter, a method of manufacturing a display apparatus according to an embodiment will be described.

Figure 10:
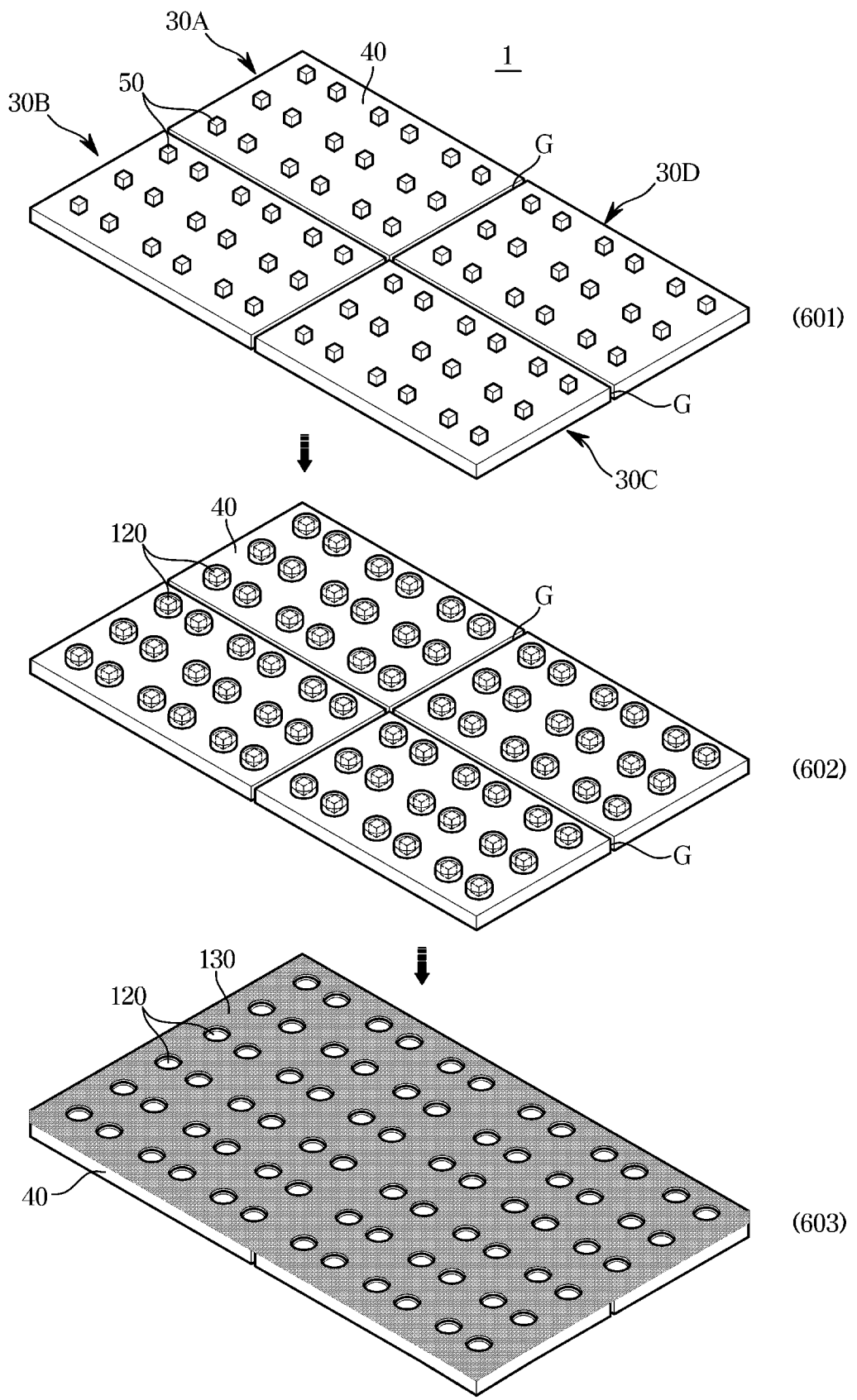
FIG. 10 briefly shows a method of manufacturing a display apparatus according to an embodiment.

FIG. 10 briefly shows a method of manufacturing a display apparatus according to an embodiment.

Referring to FIG. 10, a method of manufacturing the display apparatus 1 may include operation 601 of mounting a plurality of light-emitting devices 50 on a plurality of substrates 40 and arranging the plurality of substrates 40 to be adjacent to each other.

Then, a transparent resin 120 may be applied to surround the light-emitting devices 50, in operation 602. The transparent resin 120 may be applied at regular intervals to surround each of the light-emitting devices 50. That is, the transparent resin 120 may individually surround a red light-emitting device 51, a green light-emitting device 52, and a blue light-emitting device 53.

Also, the transparent resin 120 may surround multiple light-emitting devices constituting a unit pixel among the light-emitting devices 50. More specifically, the transparent resin 120 may surround a unit pixel that includes a red light-emitting device 51, a green light-emitting device 52, and a blue light-emitting device 53. The transparent resin 120 may be similarly applied for each unit pixel. In this case, the transparent resin 120 may be formed to a predetermined height from the light-emitting surfaces 50a of the light-emitting devices 50 toward the front direction X of display modules 30A to 30L.

The transparent resin 120 may be applied, coated, or jetted through a transparent resin supplying apparatus 160 to surround the light-emitting devices 50. However, a method of supplying the transparent resin 120 is not limited to this.

Also, as described above, the transparent resin 120 may surround the upper surfaces 50a and side surfaces of the light-emitting devices 50 and not surround the lower surfaces of the light-emitting devices 50. More specifically, because the light-emitting devices 50 are mounted on the substrate 40, the lower surfaces of the light-emitting devices 50 being in direct/indirect contact with the installation surface 41 of the substrate 40 may be not covered by the transparent resin 120.

Then, an opaque molding layer 130 may be applied to cover partial surfaces of the transparent resins 120 and fill gaps between the transparent resins 120 in operation 603. That is, the opaque molding layer 130 may be applied to surround the plurality of transparent resins 120 and cover the front surfaces of the substrates 40 such that light is emitted through the light-emitting surfaces 50a of the light-emitting devices 50. Accordingly, boundary lines or seams G that exist between the substrates 40 may be covered with the opaque molding layer 130.

The opaque molding layer 130 may be made of a liquid or solid material. Also, a black molding layer may be implemented by a film type material. For example, an opaque resin may be supplied to form the opaque molding layer 130. The opaque resin may be applied, coated, or jetted on the transparent layers 140 or the substrates 40 through an opaque resin supplying apparatus. However, a method of forming the opaque molding layer 130 is not limited to this.

The opaque molding layer 130 may include a base material and a black pigment. The base material may include at least one of a thermosetting material and a photosensitive material. For example, the thermo setting material may include at least one of silicon, epoxy, ethylene-vinyl acetate copolymer (EVA), polyvinyl butyral (PVA), and urethane. The photosensitive material may be a photosensitive material to which a photolithography process may be applied.

The opaque molding layer 130 may include a material that is a black color for increasing a light absorption effect. The opaque molding layer 130 may include an inorganic material, an organic material, a metal, etc. For example, the opaque molding layer 130 may be include a material, such as carbon black, a polyene pigment, an azo pigment, an azomethine pigment, a diimmonium pigment, a phthalocyanine pigment, a quinone pigment, an indigo pigment, a thioindigo pigment, a dioxadin pigment, a quinacridone pigment, an isoindolinone pigment, a metal oxide, a metal complex, aromatic hydrocabos, and the like.

When the opaque molding layer 130 is implemented to have a black color, a black impression may be maintained in a turned-off state of the display apparatus 1, and in a turned-on state of the display apparatus 1, an effect of improving picture quality and a contrast ratio may be expected.

As such, when the light-emitting devices 50 are surrounded by the transparent resins 120, the light-emitting devices 50 may be protected, and loss of light emitted from the light-emitting devices 50 may be reduced. Also, when the opaque molding layer 130 surrounds the side surfaces of the light-emitting devices 50 and the transparent resins 120 and covers the front surfaces of the plurality of substrates 40, the boundary lines or seams G between neighboring display modules may be prevented from being shown.

Figure 11:
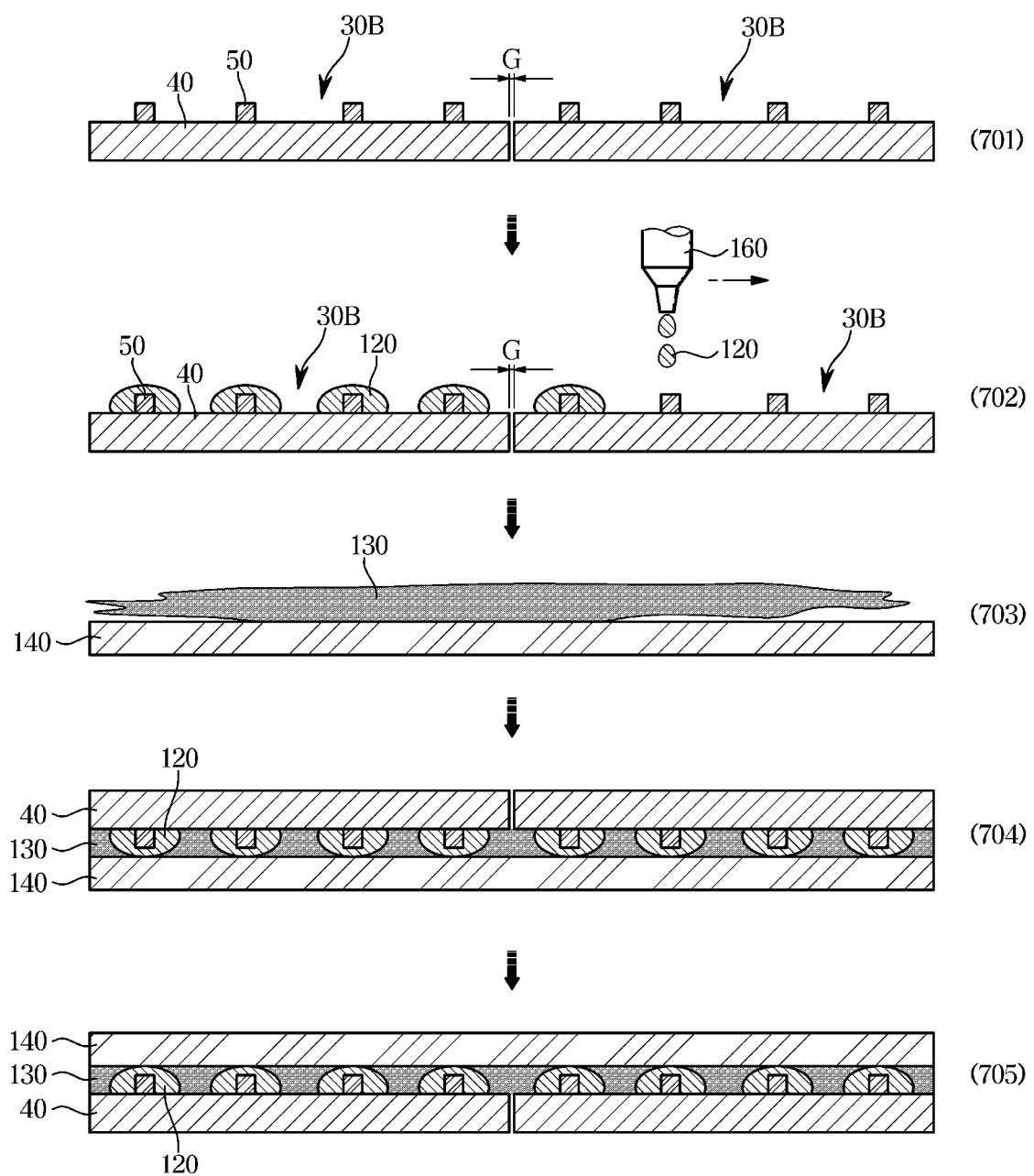
FIG. 11 is a view for describing a first method of manufacturing a display apparatus according to an embodiment.
Figure 12:
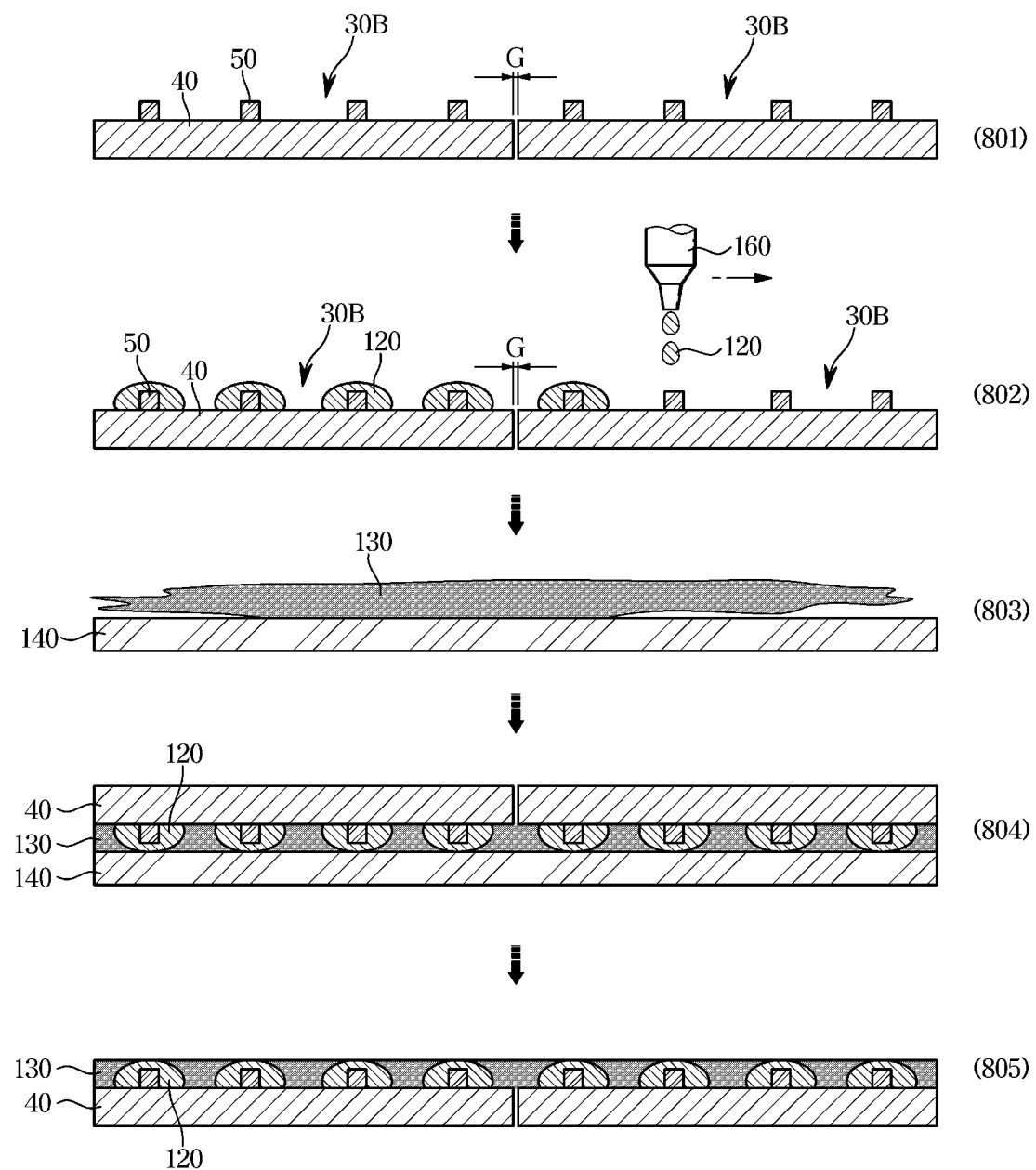
FIG. 12 is a view for describing a second method of manufacturing a display apparatus according to an embodiment.

FIG. 11 is a view for describing a first method of manufacturing a display apparatus according to an embodiment, and FIG. 12 is a view for describing a second method of manufacturing a display apparatus according to an embodiment.

Referring to FIGS. 11 and 12, the methods of manufacturing the display apparatus 1 may include operations 701 and 801 of mounting light-emitting devices 50 on a plurality of substrates 40 and arranging the plurality of substrates 40 to be adjacent to each other.

Then, a transparent resin 120 may be applied to surround the light-emitting devices 50, in operations 702 and 802. A method of surrounding the light-emitting devices 50 with the transparent resin 120 has been described above. A plurality of micro protrusions 121 may be formed in surfaces of transparent resins 120 corresponding to the light-emitting surfaces 50a of the light-emitting devices 50.

Then, an opaque resin may be applied to a rear surface of a transparent layer 140 to form an opaque molding layer 130, in operations 703 and 803. The transparent layer 140 may be formed with a size corresponding to the entire area of the substrates 40. The transparent layer 140 may be formed of a transparent material, such as glass, transparent plastic, an optical film, or the like.

Then, the transparent layer 140 on which the opaque molding layer 130 is applied may be attached to the front surfaces of the substrates 40 on which the light-emitting devices 50 surrounded by the transparent resins 120 are mounted, in operations 704 and 804. Accordingly, the opaque molding layer 130 may cover partial surfaces of the plurality of transparent resins 120 and fill gaps between the plurality of transparent resins 120.

The transparent layer 140 may planarize the opaque molding layer 130. That is, when the rear surface of the transparent layer 140 is attached to the substrates 40, a pressure may be applied to the opaque molding layer 130, and accordingly, the opaque molding layer 130 may be planarized.

The opaque molding layer 130 may surround the side surfaces of the transparent resins 120 corresponding to the respective side surfaces of the light-emitting devices 50. Also, the opaque molding layer 130 may cover boundary lines or seams G between the substrates 40. In this case, a height of the opaque molding layer 130 may be greater than or equal to a first height h1 and less than or equal to a second height h2 from installation surfaces 41 of the substrates 40.

Also, a parting agent may be provided between the transparent layer 140 and the opaque molding layer 130. After the opaque molding layer 130 is hardened, the transparent layer 140 may be removed, in operation 805. When the transparent layer 140 is removed, a thickness of the display apparatus 1 may be reduced.

Figure 13:
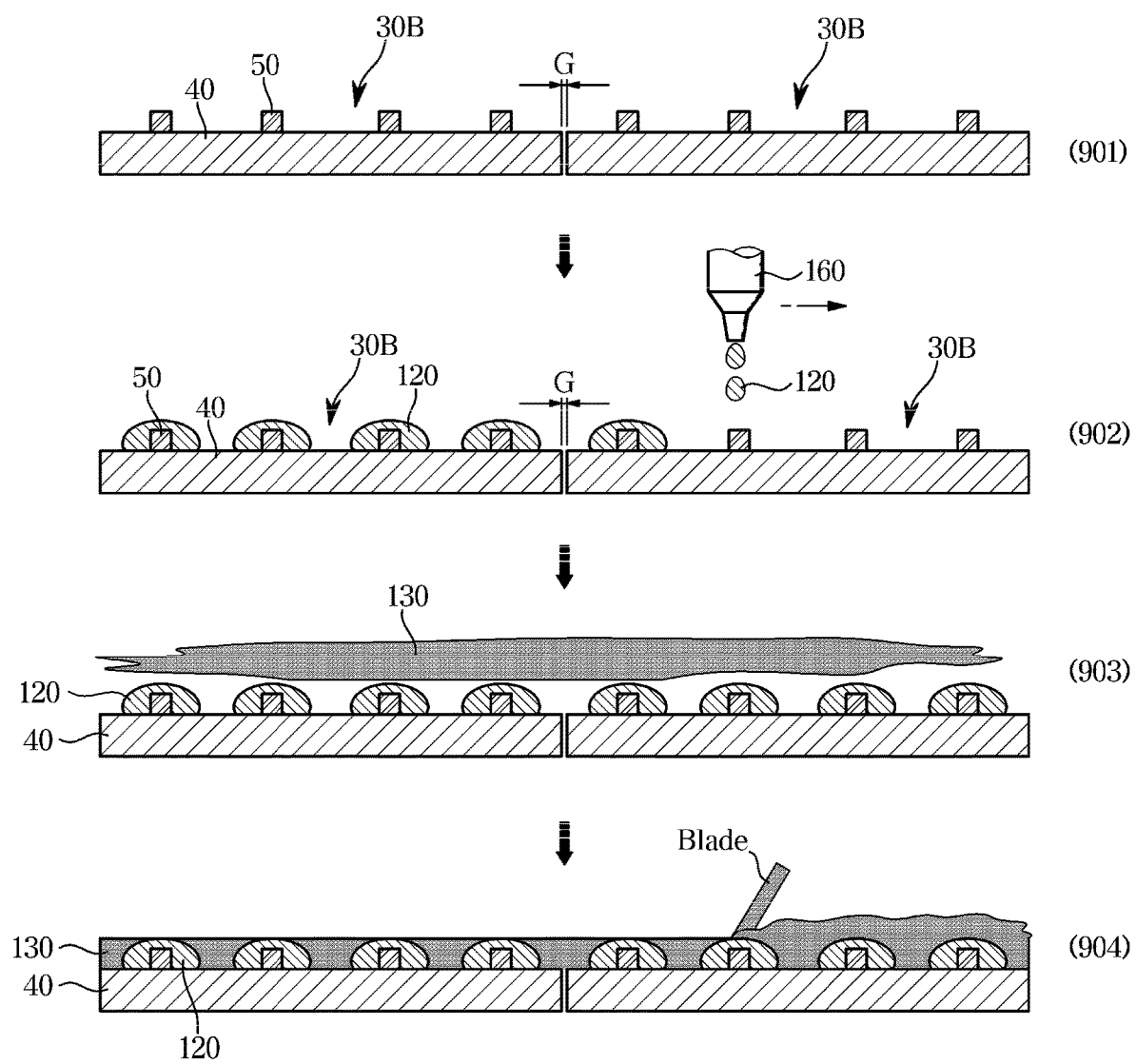
FIG. 13 is a view for describing a third method of manufacturing a display apparatus according to an embodiment.

FIG. 13 is a view for describing a third method of manufacturing a display apparatus according to an embodiment.

Referring to FIG. 13, a method of manufacturing the display apparatus 1 may include operation 901 of mounting a plurality of light-emitting devices 50 on a plurality of substrates 40 and arranging the substrates 40 to be adjacent to each other.

Then, a transparent resin 120 may be applied to surround the light-emitting devices 50, in operation 902. A method of surrounding the light-emitting devices 50 with the transparent resin 120 has been described above. A plurality of micro protrusions 121 may be formed in surfaces of transparent resins 120 corresponding to light-emitting surfaces 50a of the light-emitting devices 50.

Then, an opaque resin may be applied on the front surfaces of the substrates 40 to form the opaque molding layer 130, in operation 903. Accordingly, the opaque molding layer 130 may cover partial surfaces of the plurality of transparent resins 120 and fill gaps between the plurality of transparent resins 120. The opaque resin may be applied, coated, or jetted on the substrates 40 through an opaque resin supplying apparatus. However, a method of forming the opaque molding layer 130 on the front surfaces of the substrates 40 is not limited to this.

Then, the opaque resin may be cut to planarize a front surface of the opaque molding layer 130, in operation 904. In contrast to the method shown in FIGS. 11 and 12, a blade may be used to planarize the opaque molding layer 130. Because the method shown in FIG. 13 does not include a process of applying an opaque resin on the rear surface of a transparent layer 140 and attaching the transparent layer 140 to the plurality of substrates 40, a process of manufacturing the display apparatus 1 may be simplified.

Through the above-described process, the opaque molding layer 130 may surround the side surfaces of the plurality of transparent resins 120 corresponding to the respective side surfaces of the plurality of light-emitting devices 50. Also, the transparent molding layers 130 may cover the boundary lines or seams G between the substrates 40. A height of the opaque molding layer 130 may be greater than or equal to a first height or less than or equal to a second height from the installation surfaces 41 of the substrates 40.

As described above, in the display module, the display apparatus, and the manufacturing method of the display apparatus, according to the embodiments, the plurality of light-emitting devices mounted on the substrates may be physically protected, and the picture quality of the display apparatus may be improved due to an improvement of optical performance.

Also, in the display module, the display apparatus, and the manufacturing method of the display apparatus, according to the embodiments, when the substrates are tiled to implement a large screen, the boundary lines or seams between the neighboring substrates may be hidden.

Accordingly, by seamlessly assembling a large number of substrates, a display apparatus having a large screen size meeting a consumer's requirements may be provided.

Although a few embodiments have been shown and described, it will be appreciated by those skilled in the art that changes may be made to these embodiments without departing from the principles and spirit of the disclosure, the scope of which is defined in the claims and their equivalents.

What is claimed is:

1. A display module comprising:
   a plurality of substrates;
   a plurality of light-emitting devices mounted on each of the plurality of substrates;
   a plurality of transparent resins that surrounds the plurality of light-emitting devices; and
   an opaque molding layer that is disposed on the plurality of substrates between the plurality of transparent resins and covers partial surfaces of the plurality of transparent resins,
   wherein the opaque molding layer covers a portion of a top surface of one of the plurality of transparent resins.

2. The display module according to claim 1, wherein the opaque molding layer covers side surfaces of the plurality of transparent resins.

3. The display module according to claim 1, wherein a height of one of the plurality of light-emitting devices from a surface of a first substrate from among the plurality of substrates is a first height,
   wherein a height of one of the plurality of transparent resins from the surface is a second height, and
   wherein a height of the opaque molding layer from the surface is greater than or equal to the first height and less than or equal to the second height.

4. The display module according to claim 1, further comprising a transparent layer that covers the opaque molding layer.

5. The display module according to claim 4, wherein a portion of the opaque molding layer is interposed between the transparent layer and the one of the plurality of transparent resins along a direction perpendicular to a surface of one of the plurality of substrates.

6. The display module according to claim 1, wherein the plurality of transparent resins is arranged at regular intervals and surrounds the plurality of light-emitting devices, respectively.

7. The display module according to claim 1, wherein the plurality of light-emitting devices form a plurality of unit pixels, and
wherein the plurality of transparent resins respectively surround the plurality of unit pixels.

8. A display apparatus comprising:
a plurality of substrates;
a frame configured to support the plurality of substrates;
a plurality of light-emitting devices mounted on each of the plurality of substrates;
a plurality of transparent resins that surround the plurality of light-emitting devices;
an opaque molding layer that is disposed on the plurality of substrates between the plurality of transparent resins and covers partial surfaces of the plurality of transparent resins; and
a transparent layer that covers the opaque molding layer,
wherein the opaque molding layer covers a portion of a top surface of one of the plurality of transparent resins.

9. The display apparatus according to claim 8, wherein the opaque molding layer surrounds side surfaces of the plurality of transparent resins.

10. The display apparatus according to claim 8, wherein a height of one of the plurality of light-emitting devices from a surface of a first substrate from among the plurality of substrates is a first height,
wherein a height of one of the plurality of transparent resins from the surface is a second height, and
wherein a height of the opaque molding layer from the surface is greater than or equal to the first height and less than or equal to the second height.

11. The display apparatus according to claim 8, wherein the plurality of transparent resins is arranged at regular intervals and surrounds the plurality of light-emitting devices, respectively.

12. The display apparatus according to claim 8, wherein the plurality of transparent resins further comprise a diffusion agent for diffusing light emitted from the plurality of light-emitting devices.

13. The display apparatus according to claim 8, wherein each of the plurality of transparent resins comprise an area that is exposed by the opaque molding layer, and
wherein the area of each of the plurality of transparent resins comprises a micro protrusion.

14. A method of manufacturing a display apparatus, comprising:
adjacently arranging a plurality of substrates;
mounting a plurality of light-emitting devices on each of the plurality of substrates;
applying a plurality of transparent resins surrounding the plurality of light-emitting devices; and
applying an opaque molding layer on the plurality of substrates between the plurality of transparent resins to cover partial surfaces of the plurality of transparent resins,
wherein the opaque molding layer covers a portion of a top surface of one of the plurality of transparent resins.

15. The method according to claim 14, wherein the applying the opaque molding layer comprises applying the opaque molding layer such that the opaque molding layer covers side surfaces of the plurality of transparent resins.

16. The method according to claim 14, wherein a height of one of the plurality of light-emitting devices from a surface of a first substrate from among the plurality of substrates is a first height,
wherein a height of one of the plurality of transparent resins from the surface is a second height, and
wherein the applying the opaque molding layer comprises applying the opaque molding layer such that a height of the opaque molding layer is greater than or equal to the first height and less than or equal to the second height.

17. The method according to claim 14, wherein the applying the opaque molding layer comprises:
applying an opaque resin on a surface of a transparent layer that corresponds to an entire area of the plurality of substrates; and
attaching the transparent layer on which the opaque resin is applied to the plurality of substrates on which the plurality of transparent resins is disposed.

18. The method according to claim 17, further comprising removing the transparent layer.

19. The method according to claim 14, wherein the applying the opaque molding layer comprises:
applying an opaque resin on the plurality of substrates between the plurality of transparent resins to cover partial surfaces of the plurality of transparent resins; and
cutting the opaque resin to planarize a front surface of the opaque molding layer.

20. The method according to claim 14, wherein the applying the plurality of transparent resins further comprises forming a micro protrusion in a surface of each of the plurality of transparent resins that is exposed by the opaque molding layer.

* * * * *